United States Patent
Chung et al.

(10) Patent No.: US 9,411,191 B2
(45) Date of Patent: Aug. 9, 2016

(54) MANUFACTURING METHOD FOR LINEAR-GRID OF DISPLAY PANEL

(71) Applicant: SAMSUNG ELECTRONICS CO., LTD., Suwon-si (KR)

(72) Inventors: Seong-eun Chung, Seoul (KR); Tae-bae Kim, Hwaseong-si (KR); Il-yong Jung, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/738,320

(22) Filed: Jun. 12, 2015

(65) Prior Publication Data
US 2015/0378210 A1   Dec. 31, 2015

(30) Foreign Application Priority Data

Jun. 26, 2014   (KR) .......................... 10-2014-0079126

(51) Int. Cl.
| | | |
|---|---|---|
| *G02F 1/1335* | (2006.01) | |
| *G03F 7/40* | (2006.01) | |
| *C09K 13/00* | (2006.01) | |
| *G03F 7/004* | (2006.01) | |
| *G03F 7/09* | (2006.01) | |
| *G03F 7/00* | (2006.01) | |
| *G03F 7/095* | (2006.01) | |

(52) U.S. Cl.
CPC ............ *G02F 1/133528* (2013.01); *G03F 7/40* (2013.01); *C09K 13/00* (2013.01); *G02F 2001/133548* (2013.01); *G03F 7/0035* (2013.01); *G03F 7/0041* (2013.01); *G03F 7/094* (2013.01); *G03F 7/095* (2013.01)

(58) Field of Classification Search
None
See application file for complete search history.

(56) References Cited

U.S. PATENT DOCUMENTS

| | | | |
|---|---|---|---|
| 8,587,751 B2 | 11/2013 | Kim et al. | |
| 2004/0218123 A1* | 11/2004 | Park ................... | G02F 1/133345 349/114 |
| 2006/0118514 A1* | 6/2006 | Little .................... | B82Y 30/00 216/41 |

(Continued)

FOREIGN PATENT DOCUMENTS

| | | |
|---|---|---|
| EP | 2555044 A1 | 2/2013 |
| KR | 101073328 B1 | 10/2011 |

(Continued)

OTHER PUBLICATIONS

Communication dated Oct. 2, 2014, issued by the International Searching Authority in counterpart International Application No. PCT/KR2014/004863 (PCT/ISA/210).

(Continued)

*Primary Examiner* — Anita Alanko
(74) *Attorney, Agent, or Firm* — Sughrue Mion, PLLC

(57) ABSTRACT

A method of manufacturing a linear grid for a display panel, the method including: applying a material layer for the linear grid to a substrate; laminating a negative photoresist layer having a pattern of the linear grid to a target area within an entire area of the material layer; laminating a positive photoresist layer to the entire area of the material layer; covering, with a mask for blocking ultraviolet light, areas within the entire area not including the target area, and emitting the ultraviolet light; etching the material layer according to the negative photoresist layer exposed by the ultraviolet light; and forming the pattern of the linear grid on the material layer by removing the negative photoresist layer and the positive photoresist layer from the entire area.

20 Claims, 18 Drawing Sheets

(56) References Cited

U.S. PATENT DOCUMENTS

| | | | |
|---|---|---|---|
| 2006/0127816 A1* | 6/2006 | Kang | G03F 7/0035 430/312 |
| 2006/0139539 A1 | 6/2006 | Chen et al. | |
| 2007/0242352 A1 | 10/2007 | MacMaster | |
| 2008/0037094 A1 | 2/2008 | Hwang et al. | |
| 2008/0100781 A1 | 5/2008 | Choo et al. | |
| 2008/0106672 A1 | 5/2008 | Kim et al. | |
| 2008/0106682 A1 | 5/2008 | Matsui et al. | |
| 2008/0309845 A1 | 12/2008 | Tsujimura et al. | |
| 2009/0273728 A1 | 11/2009 | Song et al. | |
| 2011/0063545 A1 | 3/2011 | Egi et al. | |
| 2012/0206676 A1 | 8/2012 | Chung et al. | |
| 2013/0033659 A1 | 2/2013 | Chung et al. | |
| 2013/0033662 A1 | 2/2013 | Chung et al. | |
| 2013/0038569 A1 | 2/2013 | Kim et al. | |
| 2013/0270223 A1* | 10/2013 | Lee | G03F 7/031 216/24 |
| 2013/0286330 A1 | 10/2013 | Lee et al. | |
| 2014/0160396 A1 | 6/2014 | Chung et al. | |
| 2015/0029438 A1* | 1/2015 | Chung | G02F 1/133502 349/62 |

FOREIGN PATENT DOCUMENTS

| | | | |
|---|---|---|---|
| KR | 10-2012-0022935 A | 3/2012 |
| KR | 10-2012-0077196 A | 7/2012 |
| KR | 1020130015470 A | 2/2013 |
| KR | 1020130015471 A | 2/2013 |
| WO | 2010/118756 A1 | 10/2010 |

OTHER PUBLICATIONS

Communication dated Dec. 23, 2015, issued by the United States Patent and Trademark Office in counterpart U.S. Appl. No. 14/341,273.

Communication dated Feb. 2, 2016, issued by the United States Patent and Trademark Office in counterpart U.S. Appl. No. 14/245,080.

Search Report dated Oct. 2, 2014 issued by the International Searching Authority in counterpart International Patent Application No. PCT/KR2014/004787 (PCT/ISA/210).

* cited by examiner

MANUFACTURING METHOD FOR LINEAR-GRID OF DISPLAY PANEL

CROSS-REFERENCE TO RELATED APPLICATION

This application claims priority from Korean Patent Application No. 10-2014-0079126, filed on Jun. 26, 2014 in the Korean Intellectual Property Office, the disclosure of which is incorporated herein by reference in its entirety.

BACKGROUND

1. Field

Apparatuses and methods consistent with the exemplary embodiments relate to a method of manufacturing a linear grid for a display panel to form a linear grid structure on a substrate in various types of display panel, and more particularly to a method of manufacturing a linear grid for a display panel, in which a defect such as a seam line are prevented when the linear grid is formed on a substrate for a large screen.

2. Description of the Related Art

A display apparatus is an apparatus including a display panel for displaying an image based on a broadcasting signal or image signals/image data corresponding to various formats. The display apparatus can be a television (TV), a monitor, etc. The display panel can be manufactured with various structures such as with a liquid crystal panel, a plasma panel, etc., and may be applied to a variety of display apparatuses.

The display panel provided in the display apparatus may be classified into a light-receiving panel structure and a light-emitting panel structure in accordance with methods of generating light. The light-receiving panel structure includes a panel that cannot emit light by itself, and thus needs a separate backlight element for generating light and emitting the light to the panel. For example, the liquid crystal panel has a light-receiving panel structure. The light-emitting panel structure includes a panel that can emit light by itself, and thus does not need the separate backlight element. For example, an organic light emitting diode (OLED) panel has a light-emitting panel structure.

Display panels having both a light-receiving and light-emitting panel structure need a polarization layer for filtering incident light in one polarization direction, and a polarization film laminated on a glass substrate generally serves as the polarization layer. As an alternative to the polarization film, there has been proposed a method in which a linear grid (or a wire grid) of a nano scale formed on the glass substrate to be used as the polarization layer.

However one of the problems in forming the linear grid structure on the glass substrate is a mismatch between the linear grids formed in respective areas of the glass substrate may be caused when the linear grids are stepwise formed in sections on the glass substrate for a large screen. This mismatch is called a seam line. It is important to eliminate the seam line while manufacturing the linear grid to prevent a defective display panel.

SUMMARY

According to an aspect of an exemplary embodiment, a method of manufacturing a linear grid for a display panel includes: applying a material layer for the linear grid to a substrate; laminating a negative photoresist layer having a pattern of the linear grid to a target area within an entire area of the material layer; laminating a positive photoresist layer to the entire area of the material layer; covering, with a mask for blocking ultraviolet light, areas within the entire area not including the target area, and emitting the ultraviolet light; etching the material layer according to the negative photoresist layer exposed by the ultraviolet light; and forming the pattern of the linear grid on the material layer by removing the negative photoresist layer and the positive photoresist layer from the entire area.

The method may further include: forming, after the linear grid is formed in the target area, the linear grid on a next target area within the other area of the entire area.

The negative photoresist layer may have a characteristic that a molecular binding thereof becomes stronger when exposed to the ultraviolet light, and the positive photoresist layer may have a characteristic that a molecular binding thereof becomes weaker when exposed to the ultraviolet light.

The negative photoresist layer having the pattern of the linear grid pattern may be formed by applying a polyvinyl alcohol layer to a surface of a mold shaped corresponding to the pattern of the linear grid, separating the mold from the polyvinyl alcohol layer, and applying the negative photoresist layer to the polyvinyl alcohol layer.

The mold may include a silicon wafer material.

The polyvinyl alcohol layer may be removed from the negative photoresist layer having the pattern of the linear grid by washing the polyvinyl alcohol layer with water.

The etching may include applying etching gas to the target area, the negative photoresist layer may include a concave area and a convex area corresponding to the pattern of the linear grid, and the etching based on the etching gas may be limited on the material layer corresponding to the convex area, and the etching of the material layer may be performed on the material layer corresponding to the concave area.

The material layer may include at least one of silicon dioxide, silicon nitride, and poly silicon.

The entire area may be divided into a plurality of target areas, and the method may further include sequentially forming patterns of the linear grid on the plurality of target areas.

The method may further include generating the negative photoresist layer having the pattern of the linear grid pattern by applying a polyvinyl alcohol layer to a surface of a mold shaped according to the pattern of the linear grid, separating the mold from the polyvinyl alcohol layer, and applying the negative photoresist layer to the polyvinyl alcohol layer.

The generating the negative photoresist layer may further include removing the polyvinyl alcohol layer from the negative photoresist layer by washing the polyvinyl alcohol layer with a solvent.

According to an aspect of an exemplary embodiment, a method of forming a linear grid on a substrate may include: applying a negative photoresist layer having a pattern of the linear grid to a target area of a material layer on the substrate; applying a positive photoresist layer to an area of the material layer including the target area; exposing the target area to ultraviolet light; and etching the material layer according to the negative photoresist layer exposed by the ultraviolet light.

The method may further include removing the positive photoresist layer and the negative photoresist layer not removed by the exposing and the etching.

The method may further include masking, prior to the exposing, from ultraviolet light areas of the material layer other than the target area.

The method may further include repeating the method in a new target area of the material layer until the linear grid is formed over an entire area of the material layer.

The method may further include forming the negative photoresist layer by applying a polyvinyl alcohol layer to a surface of a mold shaped according to a pattern of the linear grid, separating the mold from the polyvinyl alcohol (PVA) layer, and applying the negative photoresist layer to the polyvinyl alcohol layer.

The method may further include removing the PVA layer from the negative photoresist layer by washing the PVA layer.

The etching may include applying an etching gas to the target area.

The etching of the material layer may be limited in an area of the target area corresponding to a convex area of the negative photoresist layer, and the etching of material layer is performed in an area of the target area corresponding to a concave area of the negative photoresist layer.

The method may further include: dividing an entire area of the material layer into a plurality of target areas; and forming the linear grid on the plurality of target areas.

BRIEF DESCRIPTION OF THE DRAWINGS

The above and/or other aspects will become apparent and more readily appreciated from the following description of exemplary embodiments, taken in conjunction with the accompanying drawings, in which.

DETAILED DESCRIPTION OF EXEMPLARY EMBODIMENTS

Below, exemplary embodiments will be described in detail with reference to accompanying drawings. In the following exemplary embodiments, only elements directly related to the exemplary embodiment will be described, and descriptions about the other elements will be omitted. However, it will be appreciated that the elements, the descriptions of which are omitted, may be needed to realize the apparatus or system according to one or more exemplary embodiments.

Figure 1:
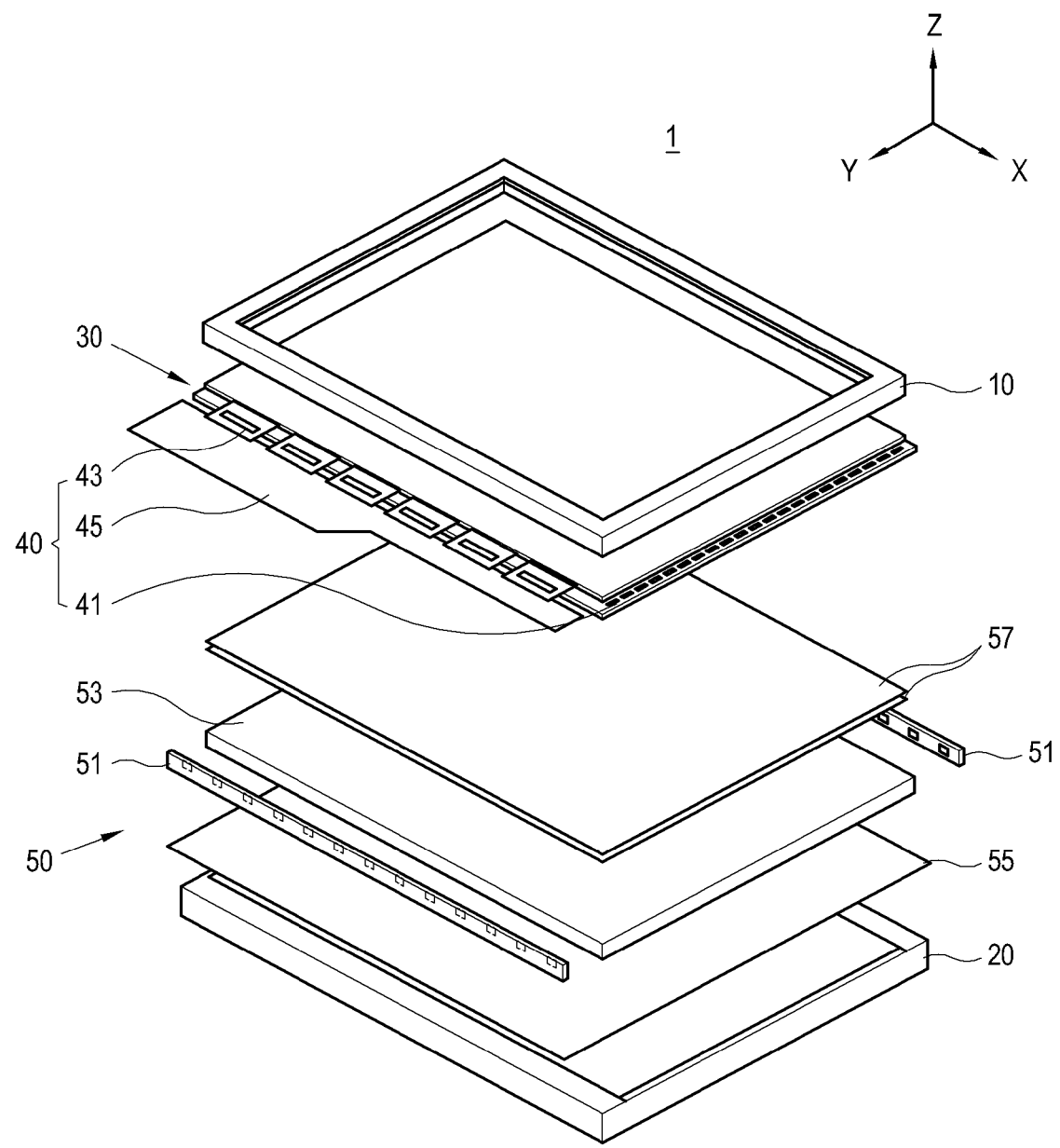
FIG. 1 is a perspective view of a display apparatus according to a first exemplary embodiment.

FIG. 1 is an exploded perspective view of a display apparatus 1 according to a first exemplary embodiment. In this exemplary embodiment, the display apparatus 1 includes a liquid crystal display panel 30, but it is not limited thereto. As a non-limiting example, the display apparatus may have a display panel having an organic light emitting diode (OLED) or the like structure that can emit light by itself.

As shown in FIG. 1, the display apparatus 1 is an apparatus capable of processing an image signal received from the exterior and displaying a processed image. In this exemplary embodiment, the display apparatus 1 is a TV. However, the display apparatus 1 may be variously achieved by a monitor, a portable multimedia player, a mobile phone, etc. as well as the TV. Thus, there is no limit to the display apparatus 1 as long as it includes the display panel 30 for displaying an image.

The display apparatus 1 includes cover frames 10 and 20 forming an accommodating space therebetween, a display panel 30 accommodated in the accommodating space between the cover frames 10 and 20 and displaying an image on an upper surface thereof, a panel driver 40 driving the display panel 30, and a backlight unit 50 facing a lower surface of the display panel 30 and emitting light to the display panel 30 within the accommodating space between the cover frames 10 and 20.

First, directions in FIG. 1 will be explained. In FIG. 1, X, Y and Z respectively indicate the length, breadth and normal directions of the display panel 30. In FIG. 1, the display panel 30 is arranged in parallel with an X-Y plane formed by axial lines of the X and Y directions. Further, the cover frames 10 and 20, the display panel 30 and the backlight unit 50 are arranged to form a laminate along an axial line of the Z direction. In addition, opposite directions to the X, Y and Z directions are represented by −X, −Y and −Z.

"Upper/upward" refers to the Z direction and "lower/downward" refers to the −Z direction unless mentioned otherwise. For example, the backlight unit 50 is arranged at a lower side of the display panel 30. Light emitted from the backlight unit 50 enters a lower surface of the display panel 30 and exits from an upper surface of the display panel 30.

The cover frames 10 and 20 form an outer appearance of the display apparatus 1, and supports the display panel 30 and the backlight unit 50 accommodated therebetween. In the drawings, if the Z direction refers to an upward or frontward direction and the −Z direction refers to a downward or rearward direction with respect to the display panel 30, the cover frames 10 and 20 includes a front cover 10 supporting the front of the display panel 30 and a rear cover 20 supporting the rear of the backlight unit 50. The front cover 10 has an opening on a plane parallel with the X-Y plane, in order to expose an image display region of the display panel 30 to the outside.

The display panel 30 is a liquid crystal type, in which a liquid crystal layer (not shown) is filled in between two substrates (not shown), and arrangement of the liquid crystal layer (not shown) is oriented in response to a driving signal, thereby displaying an image thereon. The display panel 30 cannot emit light by itself, and thus receives light from the backlight unit 50 so as to display an image therein within an image display area.

The panel driver 40 applies a driving signal for driving the liquid crystal layer (not shown) to the display panel 30. The panel driver 40 includes a gate driving integrated circuit (IC) 41, a data chip film package 43, and a printed circuit board 45.

The gate driving IC 41 is installed on a substrate (not shown) of the display panel 30, and connected to respective gate lines (not shown) of the display panel 30. The data chip film package 43 is connected to respective data lines (not shown) formed in the display panel 30. Here, the data chip film package 43 may include a tape automated bonding (TAB) tape where a TAB technique is used to adhere a semiconductor chip to a wiring pattern formed on a base film. For example, such a chip film package may use a tape carrier package (TCP), a chip on film (COF), etc. Meanwhile, a printed circuit board 45 inputs a gate driving signal to the gate driving IC 41, and a data driving signal to the data chip film package 43.

With this configuration, the panel driver 40 inputs the driving signals to the respective gate lines (not shown) and the respective data lines (not shown) of the display panel 30, thereby driving the liquid crystal layer (not shown) of the display panel 30 in units of pixel.

The backlight unit 50 is arranged in the −Z direction of the display panel 30 so as to emit light to a lower plate surface of the display panel 30. The backlight unit 50 includes a light source 51 arranged at edge regions of the display panel 30, a light guiding plate 53 arranged in parallel with the display panel 30 and facing the lower side plat surface of the display panel 30, a reflective plate 55 arranged at a lower side of the light guiding plate 53 so as to face the lower plate surface of the light guiding plate 53, and one or more optical sheets 57 interposed between the display panel 30 and the light guiding plate 53.

This embodiment describes the backlight unit 50 having an edge-type structure where the light source 51 is arranged at the edge of the light guiding plate 53 and a light emitting direction of the light source 51 is perpendicular to a light exiting direction of the light guiding plate 53. However, the backlight unit 50 is not limited to the foregoing embodiment, and may be variously achieved through workshop modification. Alternatively, the backlight unit 50 may have a direct-type structure in which for example the light source 51 is arranged at a lower side of the light guiding plate 53 and a light emitting direction of the light source 51 is in parallel with a light exiting direction of the light guiding plate 53.

The light source 51 generates light and emits the generated light to the light guiding plate 53. The light source 51 is installed standing on the plane, i.e., the X-Y plane of the display panel 30 and arranged along four directional edges of the display panel 30 or the light guiding plate 53. The light source 51 is achieved in such a manner that light emitting devices (not shown) such as a light emitting diode (LED), etc. are sequentially arranged on a module substrate (not shown) extended along the X direction.

The light guiding plate 53 is a plastic lens achieved by acrylic molded articles or the like, by which incident light is uniformly guided from the light source 51 to the entire image display area of the display panel 30. The light guiding plate 53 has a lower plate surface facing the reflective plate 55 in the −Z direction, and lateral walls corresponding to the Y and −Y directions among four lateral walls corresponding to four directions of the light guiding plate 53 formed between the upper plate surface and the lower plate surface face the light sources 51. The light emitted from the light sources 51 enters the lateral walls corresponding to the Y and −Y directions of the light guiding plate 53.

The light guiding plate 53 includes various optical patterns (not shown) on its lower plate surface in order to scatter the light traveling within the light guiding plate 53 or changing a traveling direction of the light. Thus, the light emitted from the light guiding plate 53 can be uniformly distributed.

The reflective plate 55 reflects the light coming out of the light guiding plate 53 to the light guide plate 53 again, at a lower side of the light guiding plate 53. The reflective plate 55 reflects the light, which is not reflected by optical patterns formed on the lower plate surface of the light guiding plate 53, to the light guiding plate 53 again. To this end, the upper plate surface of the reflective plate 55 has a characteristic of total reflection.

One or more optical sheets 57 are laminated on the light guiding plate 53 so as to adjust optical characteristics of light exiting from the light guiding plate 53. The optical sheets 57 may include a diffusion sheet, a prism sheet, a protective sheet, etc. To acquire a desired optical characteristic, two or more optical sheets may be combined and laminated.

Figure 2:
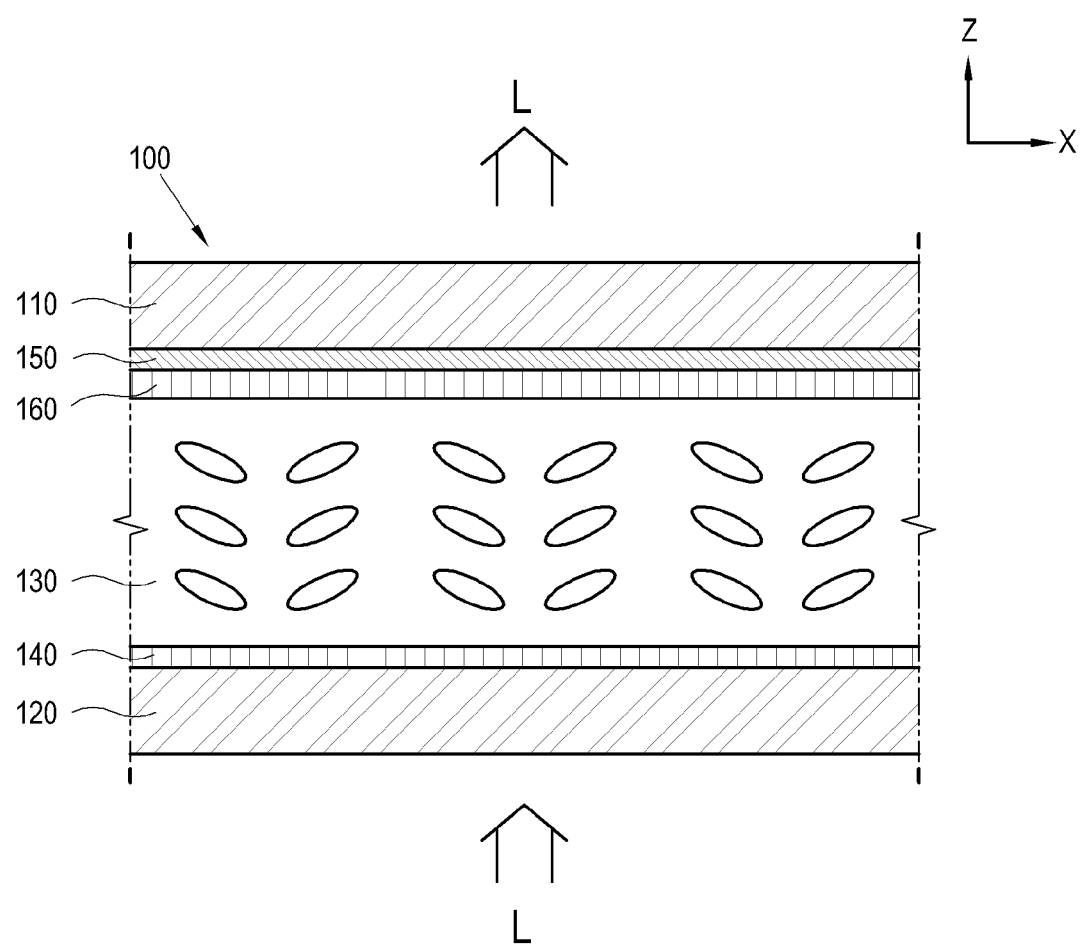
FIG. 2 is a cross-section view showing a laminating pattern of respective elements of a display panel in the display apparatus of FIG. 1.

FIG. 2 is a cross-section view showing a laminating pattern of respective elements of a display panel 100 in the display apparatus of FIG. 1. The display panel 100 of FIG. 2 is substantially the same as the display panel 30 of FIG. 1 and thus applicable to the display apparatus 1 of FIG. 1.

As shown in FIG. 2, light L emitted from the backlight unit 50 (see FIG. 1) in the Z direction enters the display panel 100 and exits in the Z direction via many elements of the display panel 100. In the following description, the upward/upper side and the downward/lower side are to represent a relative arrangement or a laminating relationship along the traveling direction Z of the emitted light L.

The display panel 100 includes an upper substrate 110, a lower substrate 120 opposite to the upper substrate 110, a liquid crystal layer 130 filled in between the upper substrate 110 and the lower substrate 120, a lower polarization layer 140 interposed in between the liquid crystal layer 130 and the lower substrate 120, an upper polarization layer 150 interposed in between the liquid crystal layer 130 and the upper substrate 110, and a color filter layer 160 interposed in between the liquid crystal layer 130 and the upper polarization layer 150. Such a display panel 100 is one of various panel structures, and may employ various panel structures in accordance with various designs. Thus, this embodiment does not limit the structure of the display panel 100.

Below, the elements of the display panel 100 will be described in more detail.

The upper substrate 110 and the lower substrate 120 are transparent substrates arranged to face each other with a predetermined space therebetween along a traveling direction of light. In light of materials, the upper substrate 110 and the lower substrate 120 may be substrates made of glass or plastic. For example, in the case of using a plastic substrate, the upper substrate 110 and the lower substrate 120 may include a material such as poly-carbonate (PC), poly-imide (PI), poly-ethersulphone (PES), poly-acrylate (PAR), poly-ethylene-naphthelate (PEN), poly-ethylene-terephehalate (PET), etc.

The upper substrate 110 and the lower substrate 120 may require preset characteristics in accordance with driving types of the liquid crystal layer 130. For example, in the case of a passive matrix type, the liquid crystal layer 130 may use soda lime glass. In the case of an active matrix type, the liquid crystal layer 120 may use alkali free glass and borosilicate glass.

The liquid crystal layer 130 is placed in between the upper substrate 110 and the lower substrate 120, and changed in orientation of liquid crystal arrangement in accordance with an applied driving signal, thereby adjusting light transmittance. General liquid is not regular in direction and arrangement of molecules, but liquid crystal is similar to a liquid phase having regularity to some extent. For example, there is a solid that becomes liquid showing anisotropy of birefringence or the like when it is heated and melted. The liquid crystal has an optical characteristic such as birefringence or color change. The regularity is the property of crystal, and the phase of the material is similar to liquid. Due to such two properties, this material is called liquid crystal. When voltage is applied to the liquid crystal, molecular arrangement is changed and thus optical characteristics are also changed.

The liquid crystal of the liquid crystal layer 130 may be classified into nematic, cholesteric, smectic and ferroelectric liquid crystal in accordance with the molecular arrangement of the liquid crystal.

The lower polarization layer 140 is formed on the plate surface of the lower substrate 120 in the Z direction, i.e. on the plate surface of the lower substrate 120, from which the emitted light L exits. The lower polarization layer 140 transmits only components corresponding to a preset first polarization direction of the emitted light L, but reflects components other than the first polarization direction.

The upper polarization layer 150 is formed on the plate surface of the upper substrate 110 in the −Z direction, i.e. on the plate surface of the upper substrate 110 that the emitted light L enters. The upper polarization layer 150 transmits only components corresponding to a preset second polarization direction of the emitted light L passing through the lower substrate 120, the lower polarization layer 140 and the liquid crystal layer 130, but reflects other components of the second polarization direction.

The second polarization direction is different from the first polarization direction, and more particularly perpendicular to the first polarization direction. This is since the polarization direction of the emitted light L is rotated at an angle of 90 degrees by the liquid crystal layer 130 as the emitted light L passes through the liquid crystal layer 130. If the upper polarization layer 150 transmits the same light component of the first polarization direction as that of the lower polarization layer 140, the emitted light of the first polarization direction passed through the lower polarization layer 140 is adjusted to have the second polarization direction while passing through the liquid crystal layer 130 so that the emitted light cannot pass through the upper polarization layer 150. Therefore, the polarization direction of the light transmitted through the upper polarization layer 150 is perpendicular to the polarization direction of the light transmitted through the lower polarization layer 140.

The upper polarization layer 150 and the lower polarization layer 140 are achieved by a linear grid (not shown) shaped like a plurality of bars (not shown) extended in one direction on an X-Y plane on the plates of the upper substrate 110 and the lower substrate 120. The respective bars (not shown) forming the linear grid (not shown) are arranged to have preset pitches, and their extending direction is provided to correspond to the polarization direction. In addition, the linear grid (not shown) of the upper polarization layer 150 protrudes from the upper substrate 110 toward the liquid crystal layer 130, and the liner grid (not shown) of the lower polarization layer 140 protrudes from the lower substrate 120 toward the liquid crystal layer 130.

Below, the structure of the lower polarization layer 140 will be described with reference to FIG. 3. The structure of the lower polarization layer 140 may also be applied to that of the upper polarization layer 150.

Figure 3:
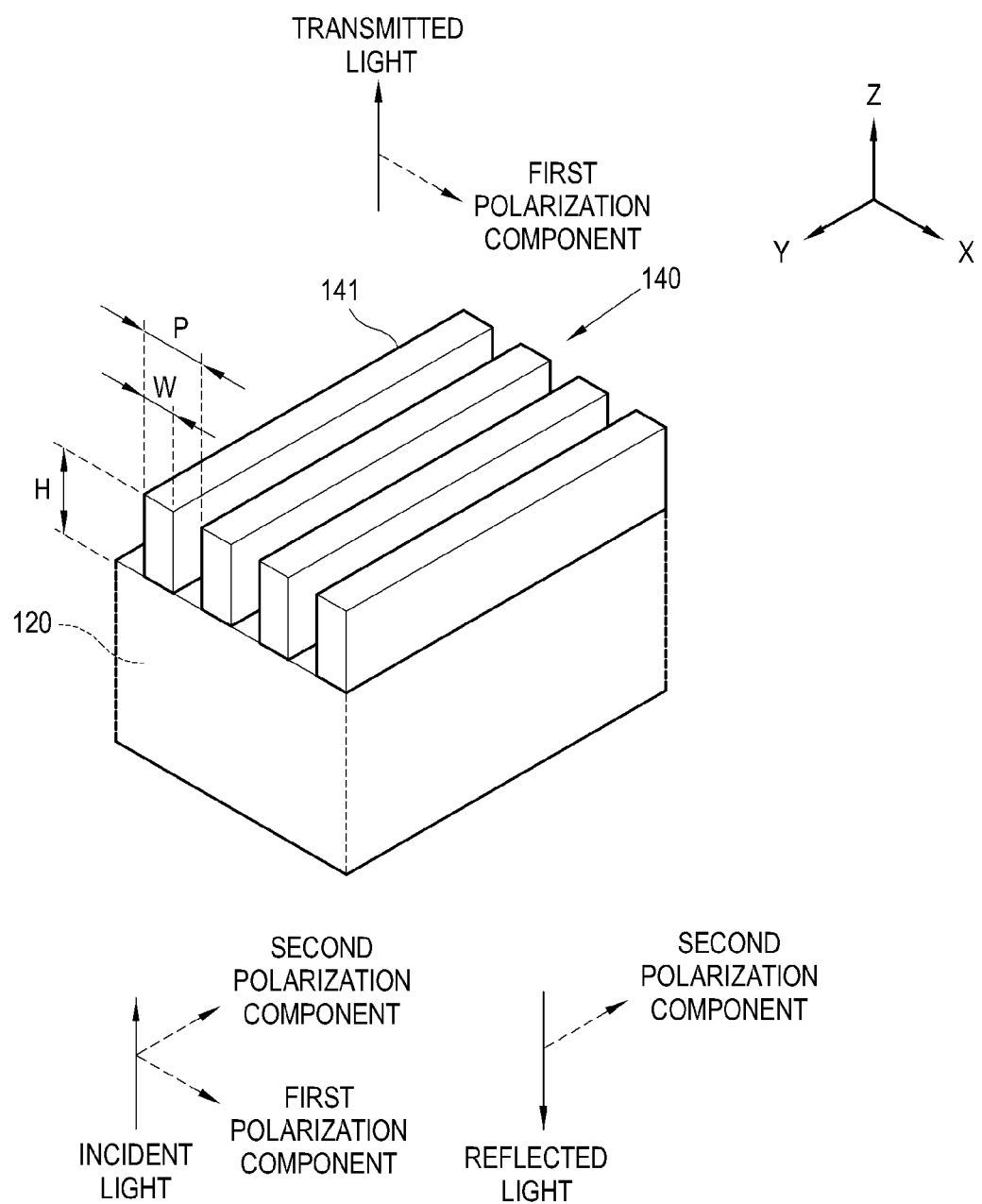
FIG. 3 is a partial perspective view of a lower polarization layer in the display panel of FIG. 2.

FIG. 3 is a partial perspective view of the lower polarization layer 140 in the display panel of FIG. 2.

As shown in FIG. 3, the lower polarization layer 140 has a linear grid (wire-grid) structure where a plurality of bars 141 protrudes in the Z direction and extends in parallel along the Y direction on the lower substrate 120. Each bar 141 has a preset height H and a width W, and the plurality of bars 141 are periodically arranged with a preset pitch P.

If the pitch P of the linear grid structure is half a wavelength of light, only transmitted light and reflected light are presented without a diffracted wave. A slit is formed in between adjacent two bars 141 in the linear grid. While incident light passes through the slit, a first polarization component of the first polarization direction perpendicular to the extending direction of the bars 141 passes through the lower polarization layer 140. On the other hand, a second polarization component of the second polarization direction parallel to the extending direction of the bar 141 does not pass through the lower polarization layer 140 but is reflected to the −Z direction. That is, such a linear grid structure allows the light passing through the lower polarization layer 140 to be polarization-filtered to have the first polarization direction.

The light reflected without passing through the lower polarization layer 140 is reflected together with the light emitted from the light source 51 (see FIG. 1) again toward the display panel 100 by the reflective plate 55 (see FIG. 1). That is, the light that does not pass through the lower polarization layer 140 is used again, and therefore a total optical efficiency of the display panel 100 for transmitting the light can be enhanced without using a conventional dual brightness enhancement film (DBEF).

To improve a polarization filtering characteristic of the lower polarization layer 140, an aspect ratio of the width W to the height H of the bar 141 may be 1:3.

Likewise, the upper polarization layer 150 has a liner grid structure similar to that of the foregoing lower polarization layer 140. The linear grid (not shown) of the upper polarization layer 150 has an extending direction perpendicular to the linear grid 141 of the lower polarization layer 140. For example, if the linear grid 141 of the lower polarization layer 140 is extended along the Y direction, the linear grid (not shown) of the upper polarization layer 150 is extended along the X direction perpendicular to the Y direction. Thus, the upper polarization layer 150 transmits only the second polarization component and blocks the first polarization component.

Figure 4:
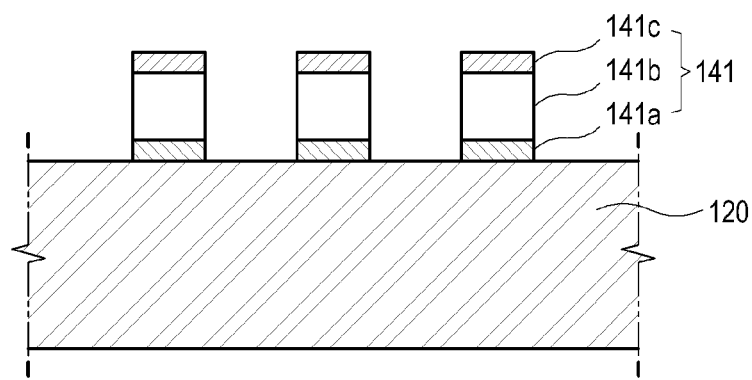
FIG. 4 is a lateral cross-section view showing an example of a laminating structure of a lower polarization layer shown in FIG. 3.

FIG. 4 is a lateral cross-section view showing an example of a laminating structure of the lower polarization layer 140.

As shown in FIG. 4, each bar 141 of the lower polarization layer 140 includes a first dielectric layer 141a, a reflective layer 141b and a second dielectric layer 141c sequentially laminated on the lower substrate 120. In light of materials, the first dielectric layer 141a includes silicon nitride (SiNx), the reflective layer 141b includes metal or poly silicon, and the second dielectric layer 141c includes silicon dioxide (SiO2). Of course, the layers are not limited to such materials, and various materials may be applied according to layers.

In this embodiment, each bar 141 includes a structure of three layers, but not limited thereto. For example, each bar may have a single-layer structure including only the reflective layer, or a two-layer structure including the reflective layer and one dielectric layer.

As described above, the linear grid structure includes the plurality of bars extended in parallel to one another on the glass substrate. Thus, a method of forming the linear grid on the substrate will be described with reference to FIG. 5 and FIG. 6.

Figure 5:
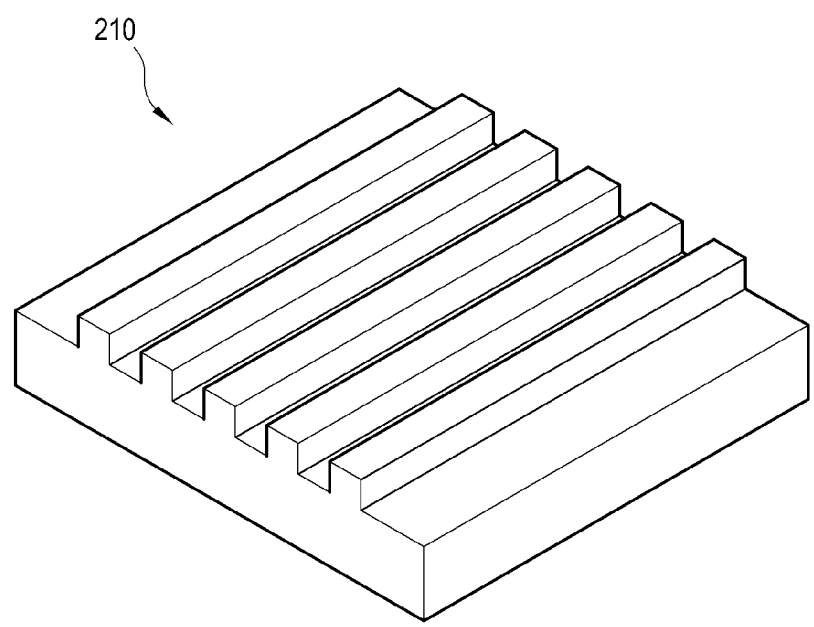
FIG. 5 shows an example of a mold for forming a linear grid according to the first exemplary embodiment.
Figure 6:
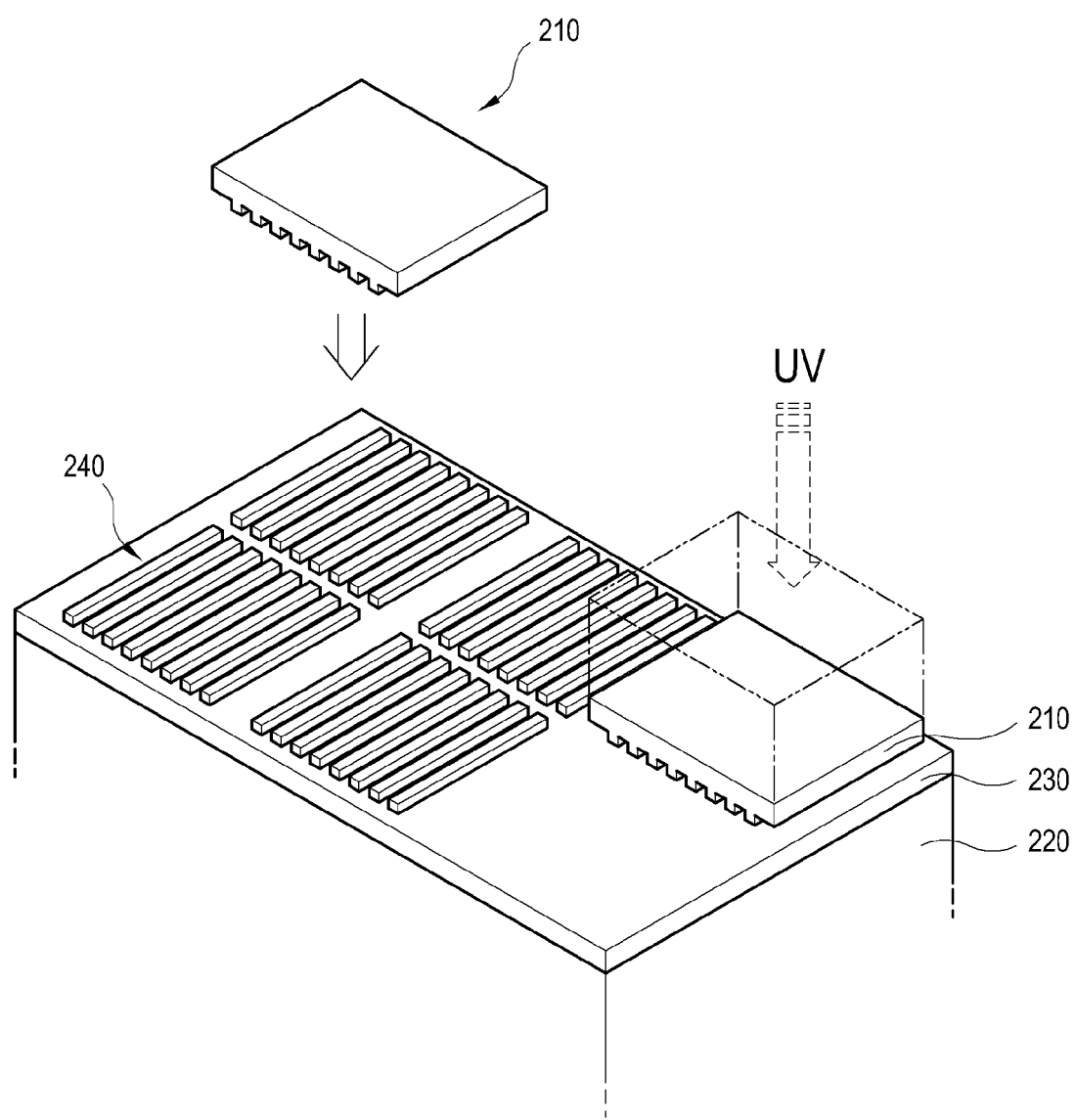
FIG. 6 shows an example of a method of forming linear grids on a large substrate with the mold of FIG. 5.

FIG. 5 shows an example of a mold 210 for forming a linear grid according to the first exemplary embodiment, and FIG. 6 shows an example of a method of forming a linear grid 240 on a large substrate 220 with the mold 210 of FIG. 5.

As shown in FIG. 5, a manufacturer manufactures the mold 210 by forming a pattern corresponding to the linear grid structure on an upper plate surface of a transparent crystal plate by, for example, E-beam lithography. Since E-beam semiconductor equipment is used for the manufacture, the size of the mold 210 is limited to a wafer size.

Below, the processes and operations performed by a manufacturer are implemented by the semiconductor equipment to be controlled by a manufacturer, a robot or a linear grid structure producing apparatus designed to produce the liner grid structure according to this exemplary embodiment.

As shown in FIG. 6, a manufacturer applies a resin 230 on to a substrate 220, and then arranges the mold 210 with the upper plate surface having the shape corresponding to the linear grid structure to face the resin 230. Further, a manufacturer presses the mold 210 against the resin 230, thereby forming the linear grid 240 on the substrate 220. The manufacturer hardens the resin 230 by emitting ultraviolet light to the resin 230 while the mold 210 presses the resin 230.

However, such processes have to be performed many times in order to manufacture a large-sized display panel since the mold 210 has a limited size. That is, the mold 210 on the substrate 220 is used many times to copy the structure of the linear grid 240. Thus, a manufacturer repetitively performs a process of forming the linear grid 240 in a partial area on the large-sized substrate 220 and then forming the linear grids 240 in the other areas on the substrate 220, thereby forming the large-sized linear grid 240.

However, in such a method, if the mold 210 does not conform to a position for pressing the resin 230 or if the mold 210 is damaged on the way of performing the whole processes, unconformity may be created between the linear grids 240 formed by the respective processes. Such unconformity between the linear grids 240 is called a seam line. The seam line causes a defective image in the display panel and the display apparatus as the end products, and thus there is a need of preventing the seam line from being generated during the manufacturing processes.

To prevent the seam line from being generated in the manufacturing method according to this exemplary embodiment, equipment for precisely positioning and pressing the mold 210 has to be developed and applied, and a new mold 210 has to be manufactured by suspending the whole processes if the mold 210 is damaged. However, this method is not efficient in light of production because of a burden of developing precise equipment and an inconvenience of replacing the mold 210.

More specifically, it is substantially impossible to reduce an error between a previous position and a new position of the mold 210 to 0 no matter how precise the equipment used by a manufacturer is. In addition, a seam line may be created if unequal pressure is applied when the mold 210 is pressed against the resin 230, but applying equal pressure is not easy. In addition, if the mold 210 is directly pressed against the resin 230, the mold 210 may be damaged by repeated use. Since the mold 210 is expensive, manufacturing a new mold 210 significantly increases production costs. Thus, the foregoing methods have many problems in preventing the seam line.

To take these points into account, a manufacturing method of preventing the seam line will be described below according to a second exemplary embodiment.

Figure 7:
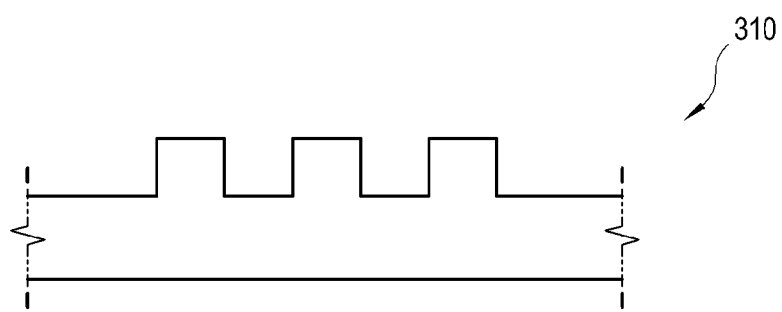
FIGS. 7 to 10 show an example of a method of sequentially forming a pattern template of a linear grid according to a second exemplary embodiment.

FIGS. 7 to 10 show an example of a method of sequentially forming a pattern template of a linear grid according to a second exemplary embodiment;

As shown in FIG. 7, a manufacturer manufactures a master mold 310 by forming a pattern corresponding to linear grid structure on a transparent crystal plate or a silicon wafer. In this exemplary embodiment, the master mold 310 is substantially the same as the foregoing mold 210 (see FIG. 5) according to the first exemplary embodiment. In the first exemplary embodiment, the mold 210 is directly pressed against the substrate so as to form the linear grid. However, in the second exemplary embodiment, the master mold 310 is used to make a pattern template for the linear grid, and the pattern template is transferred to the substrate to thereby form the linear grid.

Figure 8:
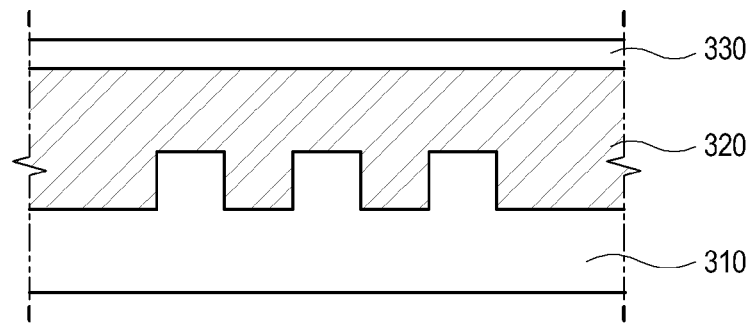

As shown in FIG. 8, a manufacturer applies a polyvinyl alcohol (PVA) 320 on the upper plate surface of the master mold 310 formed with a pattern corresponding to the linear grid structure, and adheres a carrier 330 onto PVA 320. Then, the manufacturer separates the PVA 320 from the master mold 310.

The PVA 320 can be dissolved by water or other solvents, i.e. removed by water or other solvents. In addition, there is no limit to the carrier 330 as long as the carrier 330 can easily separate the PVA 320 from the master mold 310.

Figure 9:
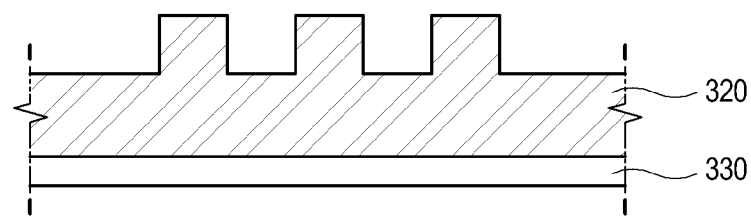

As shown in FIG. 9, the manufacturer puts the PVA 320 to face upward. That is, the manufacturer puts the PVA 320, so that its plate surface formed with the pattern corresponding to the linear grid can face upward, with the carrier 330 beneath the PVA 320.

Figure 10:
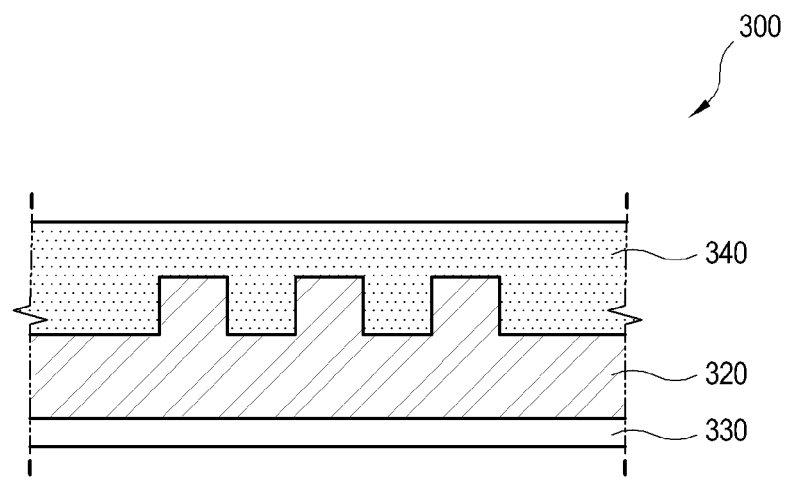

As shown in FIG. 10, the manufacturer applies a negative photoresist (PR) 340 to the plate surface of the PVA 320 formed with the pattern corresponding to the linear grid. Thus, the pattern template 300 is completed for transferring the linear grid structure to the substrate.

There are two kinds of photoresist, i.e. PR. One is the negative PR, and the other is a positive PR. The positive PR is also called a protective PR.

Such two kinds of PR are different in reaction to ultraviolet light. While molecular binding between molecules of the negative PR becomes stronger when exposed to ultraviolet light, molecular binding between molecules of the positive PR becomes weaker when exposed to the ultraviolet light. That is, the negative PR is solidified and hardened when exposed to the ultraviolet light, but the positive PR is decomposed when exposed to the ultraviolet light.

In this embodiment, the difference in characteristics between the two kinds of PR is used to form the linear grid. Below, a method of forming the linear grid structure on the substrate by the pattern template 300 will be described.

FIGS. 11 to 20 show an example of using the pattern template 300 to form a linear grid structure on a substrate 410.

Figure 11:
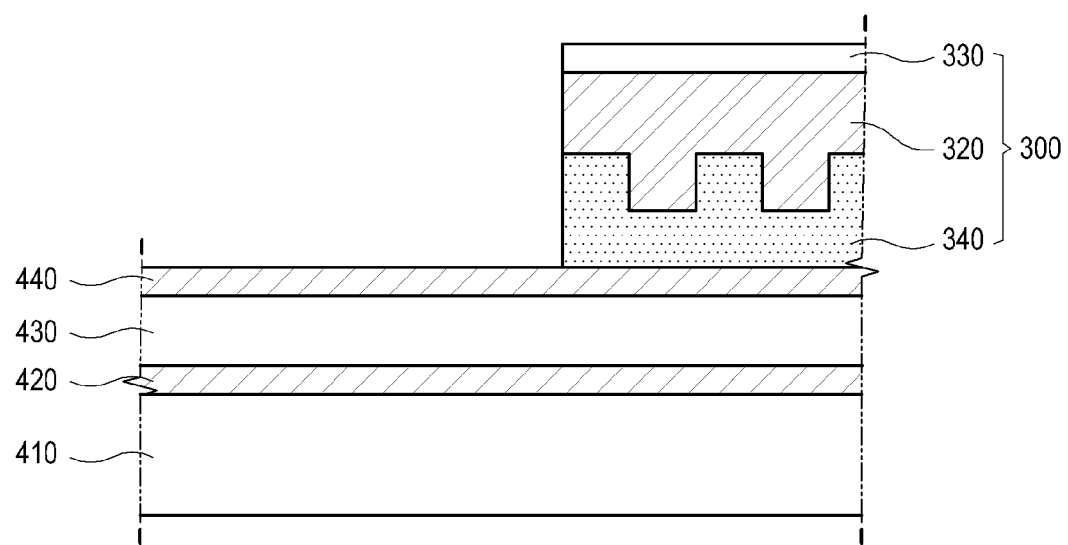
FIGS. 11 to 20 show an example of using the pattern template to form a linear grid structure on a substrate according to the second exemplary embodiment.

As shown in FIG. 11, a manufacturer applies material layers 420, 430 and 440, which constitute a linear grid, in sequence on to the substrate 410. The material layer 420, 430 and 440 may be differently applied in accordance with whether the linear grid is a single-layer structure, a two-layer structure, or a three-layer structure. In this embodiment, the linear grid is the three-layer structure, and thus an SiNx layer 420, a poly-silicon layer 430 and an SiO2 layer 440 are sequentially laminated on the substrate 410, thereby forming the linear grid with these material layers 420, 430 and 440. However, this is just a non-limiting example.

A manufacturer laminates the pattern template 300 on a certain area of the SiO2 layer 440 desired to form the linear grid structure in the substrate 410. Here, a manufacturer laminates the pattern template 300 so that the negative PR 340 of the pattern template 300 can face downward so as to contact the SiO2 layer 440.

In this state, a manufacturer uses water to remove the PVA 320 of the pattern template 300, thereby leaving only the negative PR 340 while removing the PVA 320 and the carrier 330 from the pattern template 300.

Figure 12:
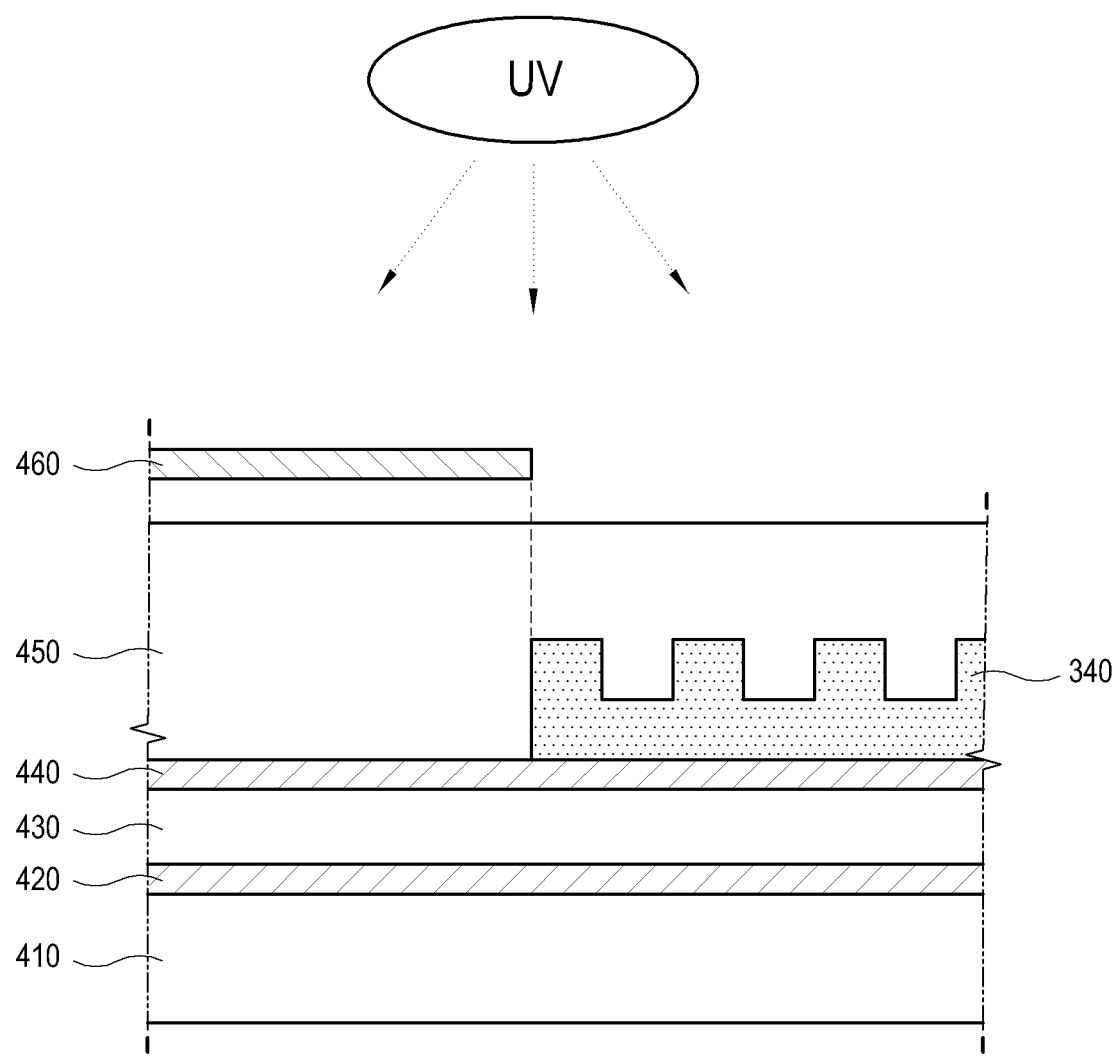

As shown in FIG. 12, a manufacturer applies the positive PR 450 on to the entire area of the substrate 410 as well as the area of the negative PR 340.

The manufacturer covers the positive PR 450 with the mask 460 within an area having no negative PR, i.e. an area where the linear grid structure is not formed in this stage process. The mask 460 has a function of blocking the ultraviolet light.

Further, a manufacturer emits the ultraviolet light to the positive PR 450. Accordingly, the area covered with the mask 460 is free from any effect of the ultraviolet light. Further, the area not covered with the mask 460, i.e. an area where the linear grid structure is desired to be formed in this stage process is affected by the ultraviolet light. In this area, the positive PR 450 is decomposed by the ultraviolet light. As the positive PR is unbound, the negative PR 340 exposed to the ultraviolet light becomes hardened by the ultraviolet light.

Figure 13:
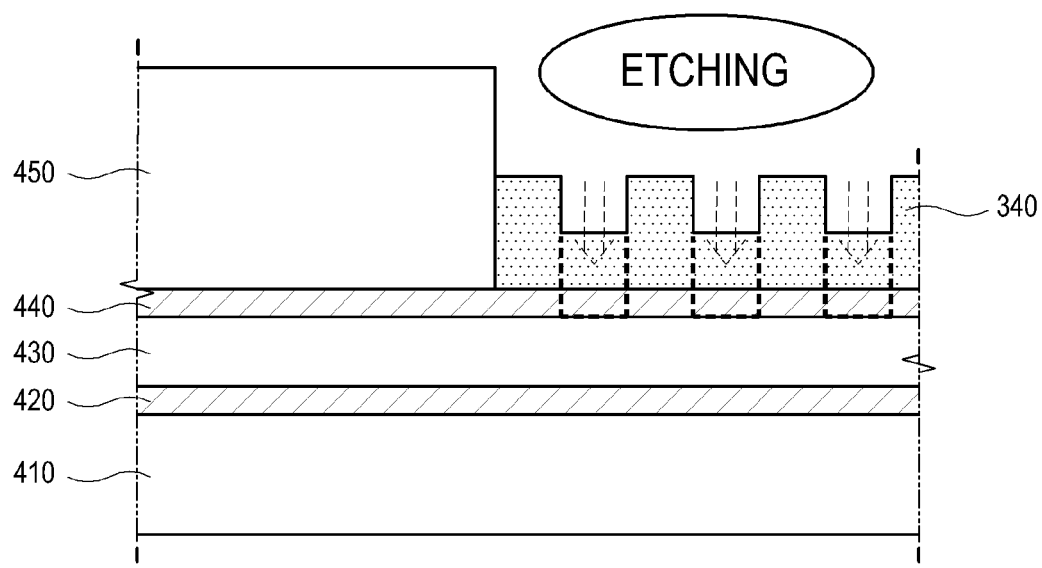

As shown in FIG. 13, a manufacturer performs dry etching with etching gas to the SiO2 layer 440, i.e. the uppermost layer among the material layers 420, 430 and 440. In a concave-convex pattern of the negative PR 340, the convex patterns serve as a hard mask for delaying and interrupting an etching operation of the etching gas, and therefore the SiO2 layer 440 is etched corresponding to the concave patterns.

The other areas on the substrate 410 are not etched due to the positive PR 450.

Since the etching gas does not react with other materials, the poly silicon layer 430 and the SiNx layer 420 are not etched by the etching gas.

Figure 14:
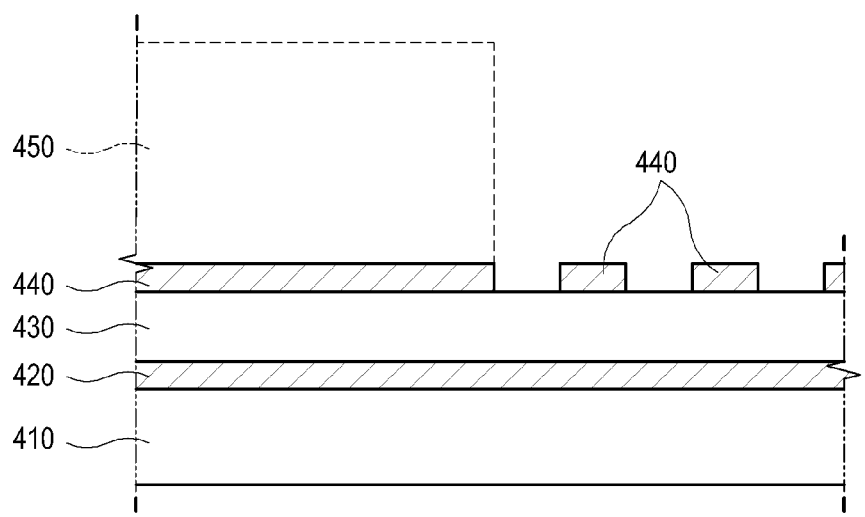

As shown in FIG. 14, a manufacturer removes the positive PR 450 of the other areas on the substrate 410. Thus, the process for etching the SiO2 layer 440 is completed with regard to a predetermined first area in the entire area of the substrate 410.

Figure 15:
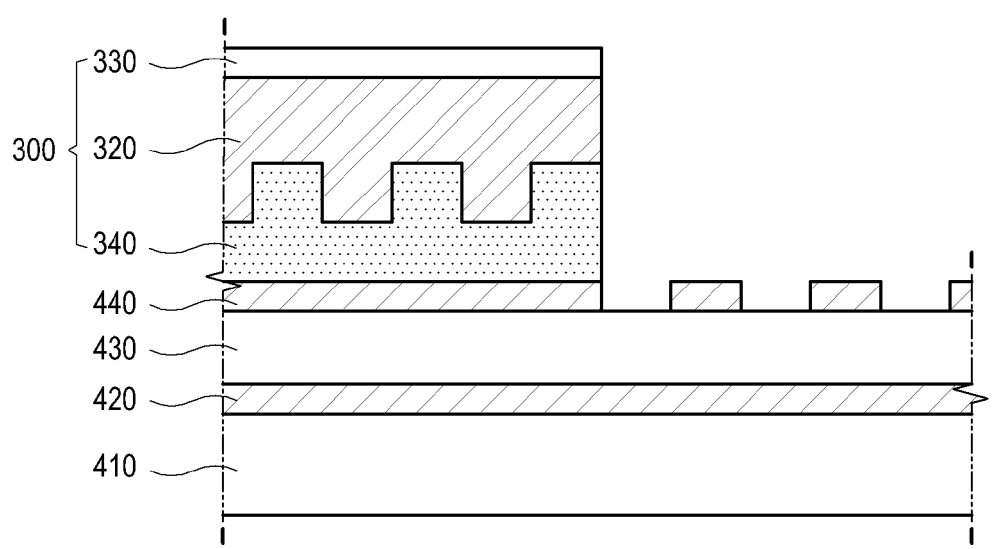

As shown in FIG. 15, a manufacturer laminates the pattern template 300 on the other area of the substrate 410 where the linear grid is not formed. The manufacturer washes the pattern template 300 with water, and thus removes the PVA 320 and the carrier 330 from the pattern template 300, leaving only the negative PR 340. The laminating pattern of the pattern template 300 and the method of removing the PVA 320 and the carrier 330 are the same as those illustrated in FIG. 11.

Figure 16:
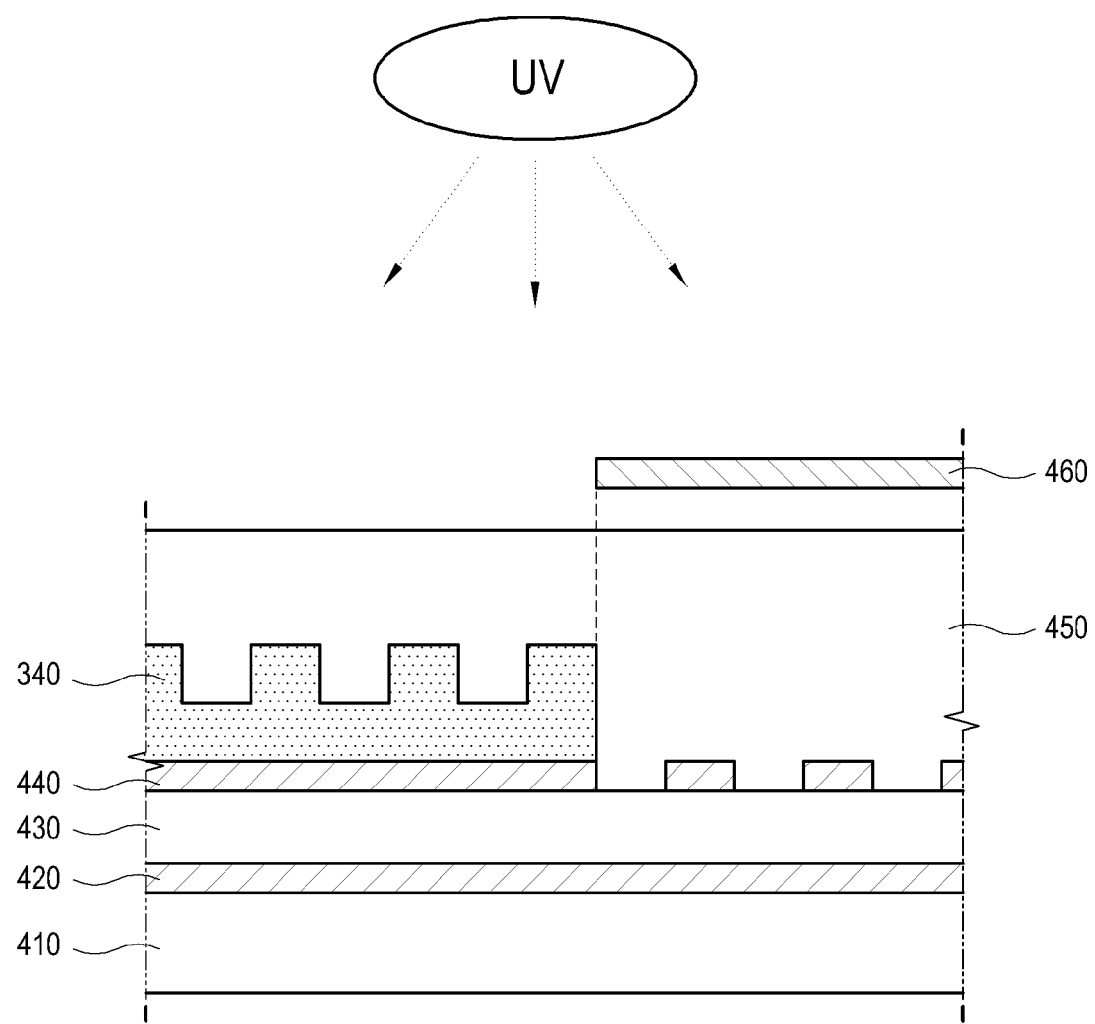

As shown in FIG. 16, a manufacturer applies the positive PR 450 to the entire area on the substrate 410 including the area corresponding to the negative PR 340.

A manufacturer covers the mask 460 on the area where the negative PR 340 is not presented, i.e. on the area where the positive PR 450 of the area where the linear grid structure is not formed in this stage process.

Further, a manufacturer exposes the positive PR 450 to the ultraviolet light. Within the area that is not covered with the mask 460, the positive PR 450 is decomposed by the ultraviolet light, and the negative PR 340 is hardened by the ultraviolet light.

Figure 17:
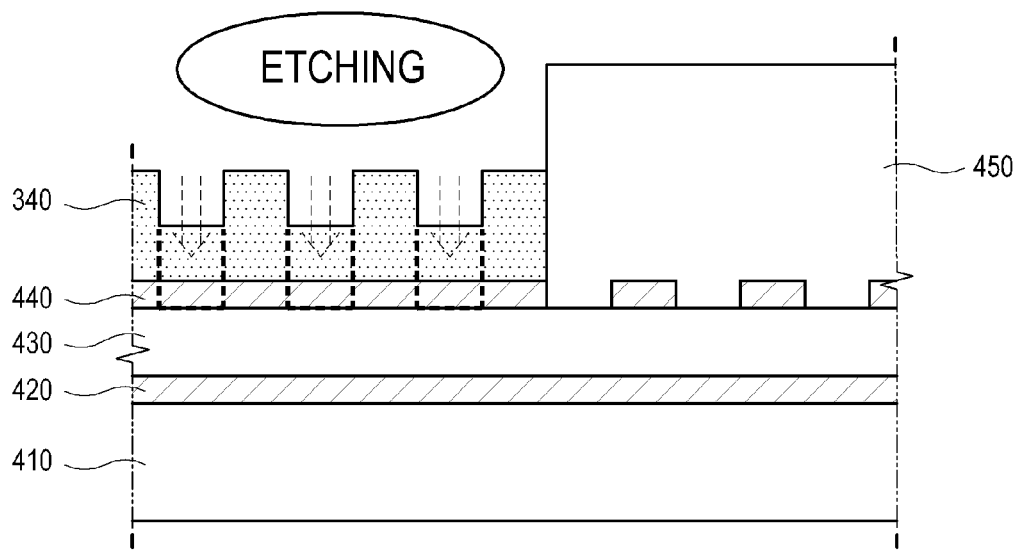

As shown in FIG. 17, a manufacturer performs dry etching using the etching gas for the SiO2 layer 440. Thus, etching is performed with regard to the SiO2 layer 440 corresponding to the concave pattern between the concavo-convex patterns of the negative PR 340.

Figure 18:
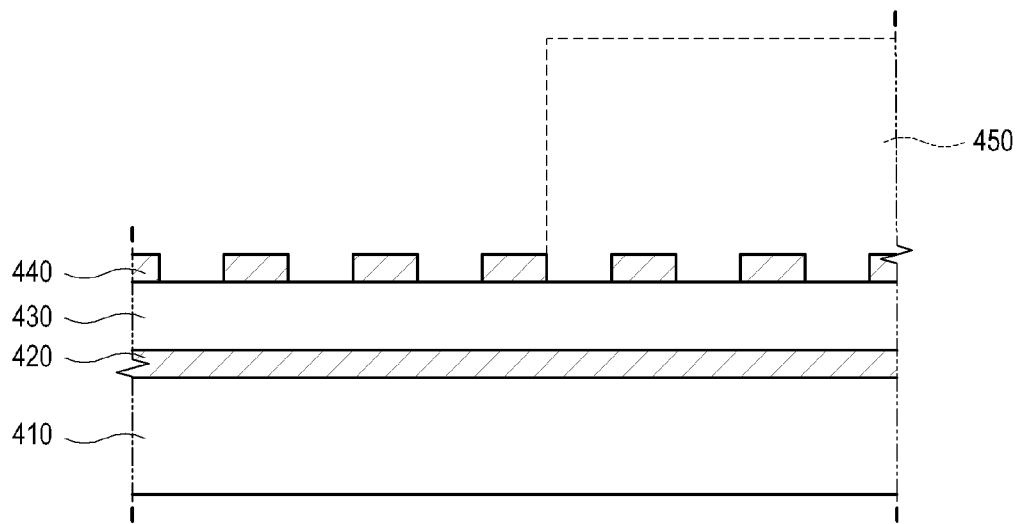

As shown in FIG. 18, when the etching is completed, a manufacturer removes the positive PR 450 from the other area on the substrate 410. Thus, the process of etching the SiO2 layer 440 is completed with regard to the other areas except the first area within the entire area of the substrate 410.

A manufacturer repetitively performs such an etching process according to areas with regard to the entire effective area on the substrate 410, so that the pattern of the SiO2 layer 440 corresponding to the linear grid structure can be formed on the substrate 410.

Figure 19:
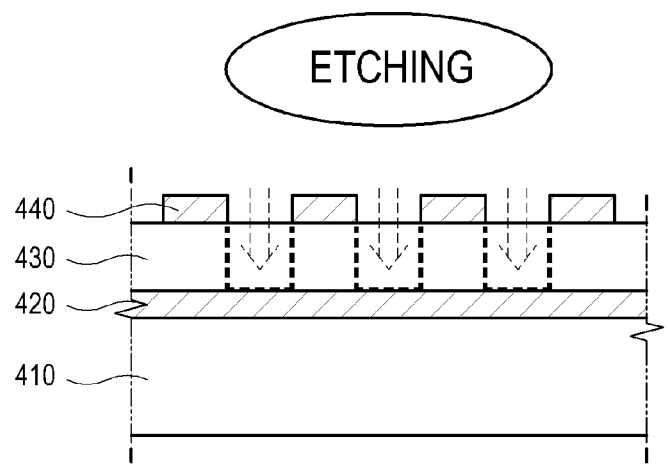

As shown in FIG. 19, when the pattern of the SiO2 layer 440 is completely formed corresponding to the linear grid structure, a manufacturer performs a process of etching the poly silicon layer 430 with the etching gas for the poly silicon layer 430. In this stage, the pattern of the SiO2 layer 440 serves as the hard mask, and therefore the poly silicon layer 430 on the area, where the SiO2 layer 440 is not formed, is etched.

Figure 20:
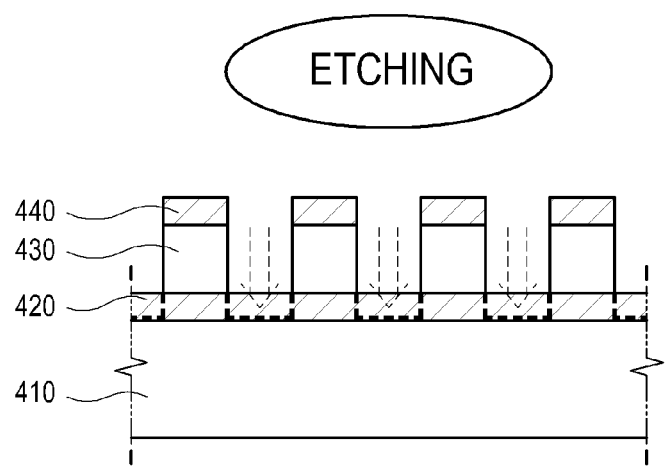

As shown in FIG. 20, when the poly silicon layer 430 is completely etched, a manufacturer performs a process of etching the SiNx layer 420 with the etching gas for etching the SiNx layer 420. In this stage, the SiO2 layer 440 and the poly silicon layer 430 are used as the hard mask, and therefore the etching is performed with regard to the SiNx layer 420 of the area where the SiO2 layer 440 and the poly silicon layer 430 are not formed.

If the etching is completed with regard to the SiNx layer 420, the linear grid structure is formed on the substrate in the form of bars as shown in FIG. 4.

Below, the foregoing processes will be summarized in brief with reference to FIG. 21.

Figure 21:
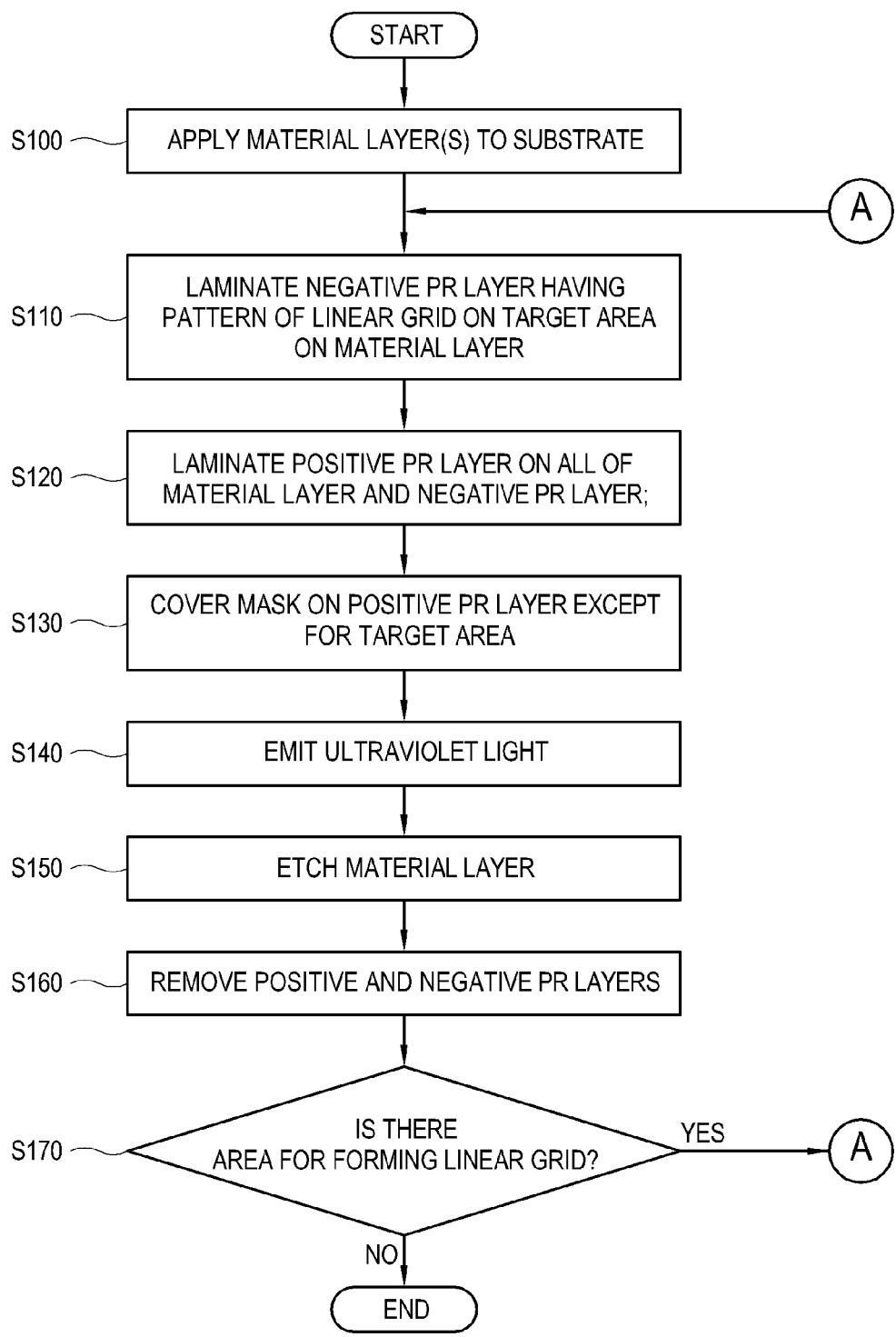
FIG. 21 is a flowchart of forming the linear grid structure on the substrate according to the second exemplary embodiment.

FIG. 21 is a flowchart describing a process of forming the linear grid structure on the substrate according to the second exemplary embodiment.

As shown in FIG. 21, at operation S100, a manufacturer applies one or more material layers for the linear grid on to the substrate. The one or more material layers may be achieved by a single layer or multiple layers in accordance with the design of the linear grid, and may include a variety of dielectrics, insulators, metals, etc.

At operation S110, a manufacturer laminates the negative PR of the linear grid pattern on a predetermined target area on the material layer. The negative PR of the linear grid pattern is formed by the pattern template as described with reference to FIGS. 7 to 10.

At operation S120, a manufacturer laminates the positive PR on the entire of the material layer and negative PR.

At operation S130, a manufacturer covers the positive PR except the target area with the mask.

At operation S140, a manufacturer performs exposure using the ultraviolet light throughout the layer. Through the exposure to the ultraviolet light, the positive PR of the target area not covered with a mask is decomposed.

At operation S150, a manufacturer performs etching with regard to the material layer. The etching gas etches the material layer within the area where the positive PR and the negative PR serving as the hard mask are not presented.

At operation S160, a manufacturer removes the positive PR and any of the negative PR not removed by the etching of S150.

At operation S170, a manufacturer determines whether there is an area for forming the linear grid structure, and repeats the processes of the foregoing operations S110 to S160 with regard to the corresponding area if there is the area for forming the linear grid structure.

With these operations, a manufacturer can form the linear grid structure on the substrate.

As described above, the second exemplary embodiment is important in that the pattern template 300 including the negative PR 340 is laminated or applied to the substrate 410 prior to the positive PR 450. That is, a manufacturer first laminates or applies the negative PR 340 to the substrate 410, and then laminates or applies the positive PR 450 on the negative PR 340. Then, the manufacturer performs the exposure to the ultraviolet light.

If the process is performed under the condition that the positive PR 450 is laminated prior to the negative PR 340, the negative PR 340 laminated on the positive PR 450 may have a difference in height due to the thickness of the positive PR 450. This difference in height results in the seam line, which will be described later.

However, if the negative PR 340 is laminated prior to the positive PR 450 according to an exemplary embodiment, it is possible to remove the foregoing cause of the seam line.

In addition, when the negative PR 340 is laminated on the substrate 410 stepwise according to a plurality of areas, the pattern of the negative PR 340 may intrude upon the area where the linear grid has already been formed. Even in this case, it is possible to prevent the seam line according to an exemplary embodiment.

Figure 22:
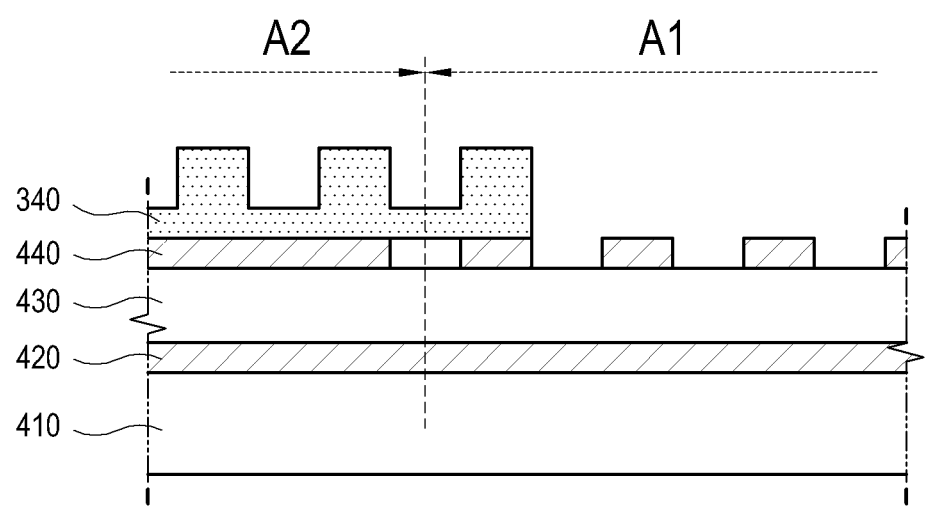
FIG. 22 shows an example where a negative photoresist (PR) pattern intrudes an area already formed with the linear grid during a process according to the second exemplary embodiment.

FIG. 22 shows an example where the pattern of the negative PR intrudes the area already formed with the linear grid according to the second exemplary embodiment.

Referring to FIG. 22, this stage is to form the linear grid structure with regard to the SiO2 layer 440 of an area A2 in the state that the linear grid structure of the SiO2 layer 440 has already been formed in the area A1. However, as shown in FIG. 22, the negative PR 340 having the linear grid pattern passes intrudes upon a portion of the area A1 beyond the area A2.

In any case, the negative PR 340 of the area A1 covers the positive PR (not shown) and is removed in the final stage of the process, thereby having no effect on the process of forming the linear grid in the area A2.

Thus, in accordance with an exemplary embodiment, it is easy to perform the process of forming the linear grid corresponding to the areas.

As compared with the second exemplary embodiment, a third exemplary embodiment where the positive PR 450 is laminated prior to the negative PR 340 will be described with reference to FIGS. 23 to 25.

Figure 23:
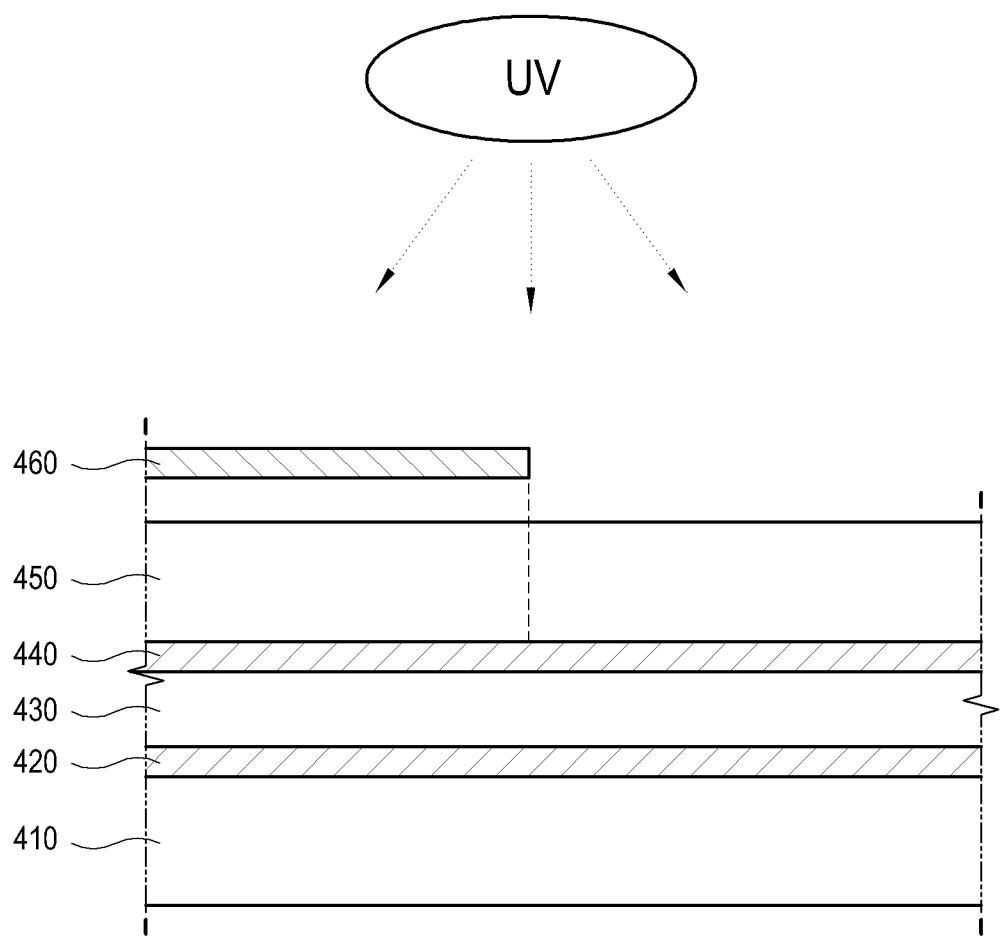
FIGS. 23 to 25 show an example of partial processes of forming a linear grid structure on a substrate according to a third exemplary embodiment.
Figure 24:
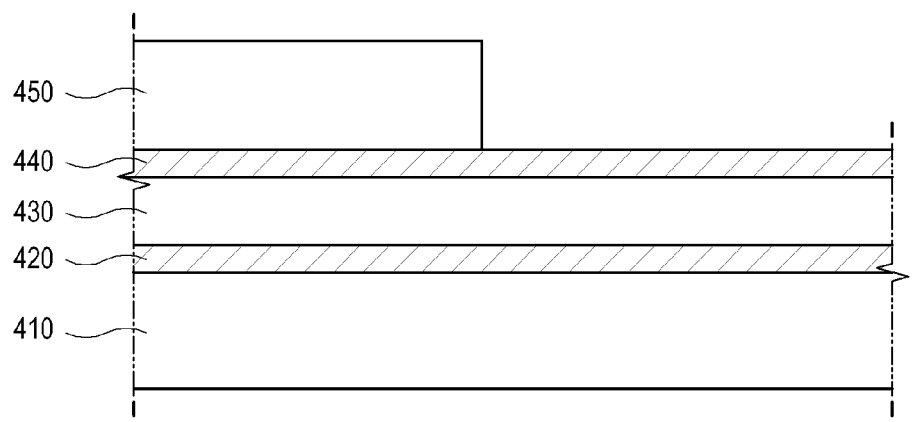
Figure 25:
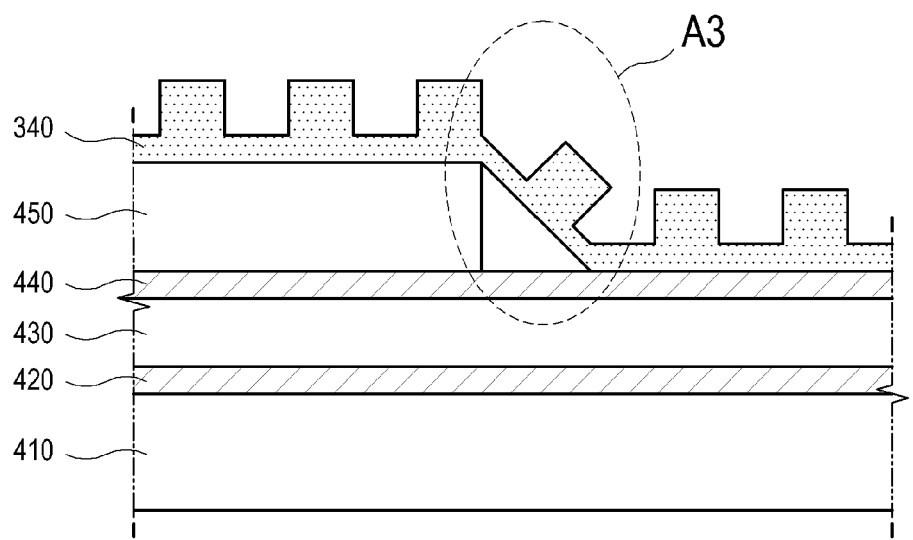

FIGS. 23 to 25 show an example of partial processes of forming a linear grid structure on a substrate 410 according to a third exemplary embodiment.

As shown in FIG. 23, a manufacturer laminates or applies the material layers 420, 430, and 440 to the substrate 410, and then laminates or applies the positive PR 450 to the material layers. The manufacturer covers the mask 460 on the other areas except the target area for forming the linear grid in this stage of the process, and exposes the areas to the ultraviolet light.

As shown in FIG. 24, if the exposure to the ultraviolet light is completed, the positive PR 450 of the target area is decomposed and removed. Therefore, the material layers 420, 430 and 440 are exposed, and the positive PR 450 on the other area except for the target area is maintained as it is.

However, as shown in FIG. 25, if the negative PR 340 having the linear grid pattern is laminated on the target area having the negative PR 340, the positive PR 450 on the other area causes difference in height A3. If not only this stage but also a stage of forming the linear grid with regard to the other area is performed, the linear grid structure has unconformity in an area corresponding to this difference in height A3. In result, a seam line may be generated in the area corresponding to the difference in height A3.

Thus, the seam line is likely to be generated in the third exemplary embodiment. As compared with the third exemplary embodiment, the second exemplary embodiment can relatively easily prevent the seam line from being formed since the negative PR 340 is laminated prior to the positive PR 450.

Although a few exemplary embodiments have been shown and described, it will be appreciated by those skilled in the art that changes may be made in these exemplary embodiments without departing from the principles and spirit of the invention, the scope of which is defined in the appended claims and their equivalents.

What is claimed is:

1. A method of manufacturing a linear grid for a display panel, the method comprising:
    applying a material layer for the linear grid to a substrate;
    laminating a negative photoresist layer having a pattern of the linear grid to a target area within an entire area of the material layer;
    laminating a positive photoresist layer to the entire area of the material layer;
    covering, with a mask for blocking ultraviolet light, areas within the entire area not including the target area, and emitting the ultraviolet light;
    etching the material layer according to the pattern of the negative photoresist layer exposed by the ultraviolet light; and
    forming the pattern of the linear grid on the material layer by removing the negative photoresist layer and the positive photoresist layer from the entire area.

2. The method according to claim 1, further comprising:
    forming, after the linear grid is formed in the target area, the linear grid on a next target area within the other area of the entire area.

3. The method according to claim 1, wherein the negative photoresist layer has a characteristic that a molecular binding thereof becomes stronger when exposed to the ultraviolet light, and the positive photoresist layer has a characteristic that a molecular binding thereof becomes weaker when exposed to the ultraviolet light.

4. The method according to claim 1, wherein the negative photoresist layer having the pattern of the linear grid pattern is formed by applying a polyvinyl alcohol layer to a surface of a mold shaped corresponding to the pattern of the linear grid, separating the mold from the polyvinyl alcohol layer, and applying the negative photoresist layer to the polyvinyl alcohol layer.

5. The method according to claim 4, wherein the mold comprises a silicon wafer material.

6. The method according to claim 4, wherein the polyvinyl alcohol layer is removed from the negative photoresist layer having the pattern of the linear grid by washing the polyvinyl alcohol layer with water.

7. The method according to claim 1, wherein the etching comprises applying etching gas to the target area,
    wherein the negative photoresist layer comprises a convex area and a concave area corresponding to the pattern of the linear grid, and
    wherein the etching based on the etching gas is limited on the material layer corresponding to the convex area, and the etching of the material layer is performed on the material layer corresponding to the concave area.

8. The method according to claim 1, wherein the material layer comprises at least one of silicon dioxide, silicon nitride, and poly silicon.

9. The method according to claim 1, wherein the entire area is divided into a plurality of target areas, and the method further comprises sequentially forming patterns of the linear grid on the plurality of target areas.

10. The method according to claim 1, further comprising:
    generating the negative photoresist layer having the pattern of the linear grid pattern by applying a polyvinyl alcohol layer to a surface of a mold shaped according to the pattern of the linear grid, separating the mold from the polyvinyl alcohol layer, and applying the negative photoresist layer to the polyvinyl alcohol layer.

11. The method according to claim 10, wherein the generating the negative photoresist layer further comprises removing the polyvinyl alcohol layer from the negative photoresist layer by washing the polyvinyl alcohol layer with a solvent.

12. A method of forming a linear grid on a substrate, the method comprising:
  applying a negative photoresist layer having a pattern of the linear grid to a target area of a material layer on the substrate;
  applying a positive photoresist layer to an area of the material layer including the target area;
  exposing the target area to ultraviolet light; and
  etching the material layer according to the negative photoresist layer exposed by the ultraviolet light.

13. The method according to claim 12, further comprising:
  removing the positive photoresist layer and the negative photoresist layer not removed by the exposing and the etching.

14. The method according to claim 12, further comprising:
  repeating the method in a new target area of the material layer until the linear grid is formed over an entire area of the material layer.

15. The method according to claim 12, further comprising:
  forming the negative photoresist layer by applying a polyvinyl alcohol layer to a surface of a mold shaped according to a pattern of the linear grid, separating the mold from the polyvinyl alcohol (PVA) layer, and applying the negative photoresist layer to the polyvinyl alcohol layer.

16. The method according to claim 12, wherein the etching comprises applying an etching gas to the target area.

17. The method according to claim 12, further comprising:
  dividing an entire area of the material layer into a plurality of target areas; and
  forming the linear grid on the plurality of target areas.

18. The method according to claim 12, further comprising:
  masking, prior to the exposing, from ultraviolet light areas of the material layer other than the target area.

19. The method according to claim 15, further comprising removing the PVA layer from the negative photoresist layer by washing the PVA layer.

20. The method according to claim 16, wherein the etching of the material layer is limited in an area of the target area corresponding to a convex area of the negative photoresist layer, and the etching of material layer is performed in an area of the target area corresponding to a concave area of the negative photoresist layer.

* * * * *